(12) United States Patent
Tsuchikawa et al.

(10) Patent No.: US 7,208,539 B2
(45) Date of Patent: Apr. 24, 2007

(54) THERMOSETTING RESIN COMPOSITION, AND PREPREG AND LAMINATED BOARD USING THE SAME

(75) Inventors: Shinji Tsuchikawa, Shimodate (JP); Michitoshi Arata, Shimodate (JP); Kenichi Tomioka, Shimodate (JP); Kazuhito Kobayashi, Shimodate (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/511,102

(22) PCT Filed: Apr. 16, 2003

(86) PCT No.: PCT/JP03/04799

§ 371 (c)(1),
(2), (4) Date: Oct. 14, 2004

(87) PCT Pub. No.: WO03/087230

PCT Pub. Date: Oct. 23, 2003

(65) Prior Publication Data

US 2005/0234173 A1    Oct. 20, 2005

(30) Foreign Application Priority Data

Apr. 16, 2002  (JP) .............................. 2002-113017

(51) Int. Cl.
*B32B 27/30* (2006.01)
*B32B 27/38* (2006.01)
*C08L 67/00* (2006.01)
*C08L 25/08* (2006.01)
*C08L 25/14* (2006.01)
*C08L 35/00* (2006.01)
*C08L 45/00* (2006.01)

(52) U.S. Cl. ................... 524/415; 525/466; 525/333.3; 525/328.2; 525/327.4; 525/207; 525/208; 525/210; 428/500; 428/416; 428/901; 428/413; 260/860; 260/863

(58) Field of Classification Search ................ 524/116, 524/6, 415; 525/207, 208; 428/466, 500; 260/47, 860
See application file for complete search history.

(56) References Cited

U.S. PATENT DOCUMENTS

| 3,046,231 | A | * | 7/1962 | Comar et al. ............... 510/537 |
| 3,900,444 | A |   | 8/1975 | Racky et al. |
| 3,953,539 | A | * | 4/1976 | Kawase et al. ............. 524/116 |
| 4,128,598 | A | * | 12/1978 | Makino et al. ............. 525/502 |
| 4,777,227 | A | * | 10/1988 | Wrezel et al. ............. 525/207 |
| 6,355,832 | B1 |  | 3/2002 | Weferling et al. |
| 6,365,071 | B1 |  | 4/2002 | Jenewein et al. |
| 6,420,459 | B1 |  | 7/2002 | Horold |
| 6,534,181 | B2 | * | 3/2003 | Luttrull ....................... 428/416 |
| 6,547,992 | B1 |  | 4/2003 | Schlosser et al. |
| 6,667,107 | B2 | * | 12/2003 | Tsuchikawa et al. ........ 428/500 |
| 2002/0147277 | A1 |  | 10/2002 | Tsuchikawa et al. |

FOREIGN PATENT DOCUMENTS

| EP | 1 024 167 A1 | 8/2000 |
| EP | 1024167 B1 | 8/2000 |
| JP | 49-109476 | 10/1974 |
| JP | 01-221413 | 9/1989 |
| JP | 04-076018 | 3/1992 |
| JP | 04-076019 | 3/1992 |
| JP | 04-088054 | 3/1992 |
| JP | 06-092532 | 11/1994 |
| JP | 06-092533 | 11/1994 |
| JP | 06-092534 | 11/1994 |
| JP | 07-247415 | 9/1995 |
| JP | 07-258537 | 10/1995 |
| JP | 07-268205 | 10/1995 |
| JP | 09-025349 | 1/1997 |
| JP | 10-017685 | 1/1998 |
| JP | 10-017686 | 1/1998 |
| JP | 10-505376 | 5/1998 |
| JP | 2000-508365 | 4/2000 |
| JP | 2000-219775 | 8/2000 |
| JP | 2001-525327 | 12/2001 |
| JP | 2002-161211 | 6/2002 |
| JP | 2002-161211 A | 6/2004 |
| WO | WO 97/39053 | 10/1997 |
| WO | WO 99/28327 | 6/1999 |

OTHER PUBLICATIONS

International Search Report, completed Jul. 16, 2003, for corresponding International Application No. PCT/JP03/04799.
Taiwanese Office Action (Chinese Language) issued in the counterpart Taiwanese Patent Application of this present application on Aug. 21, 2006.

* cited by examiner

*Primary Examiner*—Duane Smith
*Assistant Examiner*—Ives Wu
(74) *Attorney, Agent, or Firm*—Griffin & Szipl, P.C.

(57) ABSTRACT

The present invention relates to a thermosetting resin composition comprising: (1) a metal salt of a disubstituted phosphinic acid, and (2) a resin having a dielectric constant of 2.9 or less at a frequency of 1 GHz or more, and a prepreg and a laminated board using the same.

16 Claims, No Drawings

THERMOSETTING RESIN COMPOSITION, AND PREPREG AND LAMINATED BOARD USING THE SAME

This is a National Phase Application in the United States of International Patent Application No. PCT/JP03/04799 filed Apr. 16, 2003, which claims priority on Japanese Patent Application No. 2002-113017, filed Apr. 16, 2002. The entire disclosures of the above patent applications are hereby incorporated by reference.

TECHNICAL FIELD

The present invention relates to a thermosetting resin composition which is excellent in electric characteristics, flame retardancy, heat resistance, moisture resistance and adhesive properties. The present invention further relates to a prepreg and a laminated board for electric insulation materials using the composition.

BACKGROUND ART

For a printed wiring board for electronic appliances, a laminated board using a resin composition mainly composed of an epoxy resin is widely used. Recently, with the tendencies that a pattern becomes finer due to increase in mounting density in electronic appliances, a surface mounting system is more established, a signal propagation velocity becomes higher, and a frequency of signals used becomes higher, a development of printed wiring board materials having a low dielectric constant, a low dielectric loss and an improved heat resistance is strongly desired.

On the other hand, it is required to avoid the use of halogen-based flame retardant in resin compositions in view of its adverse affect on environments. Therefore, a halogen-free alternative material having excellent flame retardancy is also strongly desired.

With respect to a resin composition mainly composed of a resin other than an epoxy resin, studies are made on a resin composition and the like using styrene or a polyphenylene ether resin. Examples of the resin composition or laminated board using a polyphenylene ether resin are disclosed, for example, in Japanese Unexamined Patent Publication No. Hei 4-076018, Japanese Unexamined Patent Publication No. Hei 4-076019, Japanese Unexamined Patent Publication No. Hei 7-247415, Japanese Unexamined Patent Publication No. Hei 7-258537, Japanese Examined Patent Publication No. Hei 6-092532, Japanese Examined Patent Publication No. Hei 6-092533, Japanese Examined Patent Publication No. Hei 6-092534, etc. Examples of the resin composition or laminated board using a styrene resin and a polyphenylene ether resin are disclosed, for example, in Japanese Unexamined Patent Publication No. Hei 4-088054 and Japanese Unexamined Patent Publication No. Hei 7-268205. However, a halogen-based flame retardant is used in any of these resin compositions or laminated boards.

Improvement in properties is also attempted by combining an epoxy resin with another resin. For an example of a resin composition or laminated board using an epoxy resin as a curing agent and using a copolymer resin composed of styrene and maleic anhydride, for example, Japanese Unexamined Patent Publication No. Sho 49-109476 describes a flexible printed wiring board using a flexible epoxy resin and a copolymer resin composed of styrene and maleic anhydride, wherein a reactive epoxy diluent and an acrylonitrile-butadiene copolymer are essential for imparting flexibility to the printed wiring board. Japanese Unexamined Patent Publication No. Hei 1-221413 describes an epoxy resin compound comprising an epoxy resin, a copolymer resin having an acid value of 280 or more, which is obtained from an aromatic vinyl compound and maleic anhydride, and dicyandiamide. Further, Japanese Unexamined Patent Publication No. Hei 9-025349 describes a prepreg and a laminated board material for electrical appliances, containing a brominated epoxy resin, a copolymer resin composed of styrene and maleic anhydride (epoxy resin curing agent), a styrene compound, and a solvent. Japanese Unexamined Patent Publications No. Hei 10-017685 and No. Hei 10-017686 describe a prepreg and a laminated board material for electrical appliances, containing an epoxy resin, a copolymer resin composed of an aromatic vinyl compound and maleic anhydride, and a phenolic compound. Japanese Unexamined national Patent Publication (kohyo) No. Hei 10-505376 describes a resin composition, a laminated board, and a printed wiring board, containing an epoxy resin, a carboxylic anhydride-type cross-linking agent for epoxy resin, and an allyl linkage-forming compound. However, these materials are not satisfactory in characteristics required with the tendencies to a finer pattern forming and a higher frequency of signals, for example, low dielectric loss, high heat resistance, high moisture resistance, and high adhesiveness to a copper foil. In addition, these materials have problems that a halogen-based flame retardant compound is used or flame retardancy is low.

For the halogen-free-type flame retardant, a phosphorus-containing compound is usually used. Examples thereof include condensed phosphates such as red phosphorus, phosphoric acid, triphenyl phosphate, etc.; phosphoric acid derivatives such as ammonium polyphosphate; and reactive phosphorus-containing compounds such as phosphorus-containing epoxy resin and hydroxyl group containing phosphorus compound. However, when flame retardancy is imparted using these phosphorus-containing compounds, an adverse affect is liable to be exerted on dielectric constant, dielectric loss, heat resistance, moisture resistance or electrolytic corrosion resistance.

The object of the present invention is to provide a thermosetting resin composition which is excellent in all of dielectric property, dielectric loss, heat resistance, flame retardancy, moisture resistance, and adhesiveness to a copper foil, even though the halogen-free flame retardant is used in view of the above-described problems; and a prepreg and laminated board using the resin composition.

SUMMARY OF THE INVENTION

The present invention relates to a thermosetting resin composition comprising (1) a metal salt of a disubstituted phosphinic acid and (2) a resin having a dielectric constant of 2.9 or less at a frequency of 1 GHz or more.

More specifically, the present invention relates to a thermosetting resin composition comprising a metal salt of a disubstituted phosphinic acid, wherein the dielectric constant of the thermosetting resin composition is 3.0 or less at a frequency of 1 GHz or more.

Further, the present invention relates to a prepreg using the above-mentioned thermosetting resin.

Still further, the present invention relates to a laminated board formed by laminating the above-mentioned prepreg.

BEST MODE FOR CARRYING OUT THE INVENTION

Hereinafter, the present invention is explained in detail.

In the present invention, the weight average molecular weight is a value measured by gel permeation chromatography using tetrahydrofuran as an eluent, and converted using a standard polystyrene calibration curve.

In the present invention, a dielectric constant and a dielectric dissipation factor of the composition of the present invention are measured at a frequency of 1 GHz using a dielectric constant measurement apparatus (trade name: HP4291B), produced by Hewlett-Packard Company. For a test sample on this occasion, a resin sheet or a substrate of a copper-clad laminated board from which copper foils are removed, which is prepared using the composition of the present invention, is used.

The thermosetting resin composition of the present invention is a thermosetting resin composition comprising component (1), which is a metal salt of a disubstituted phosphinic acid, as an essential component, wherein the dielectric constant of the composition is 3.0 or less at a frequency of 1 GHz or more. The dielectric constant is preferably 2.2 to 3.0, particularly preferably 2.4 to 2.9 in view of a balance with low dielectric loss, heat resistance, moisture resistance and flame retardancy, etc.

It is preferable that the metal salt of a disubstituted phosphinic acid, which is component (1) of the present invention, is a metal salt of a disubstituted phosphinic acid represented by the following formula (I):

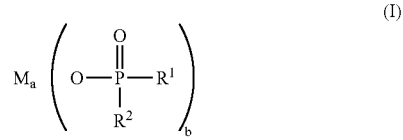

wherein $R^1$ and $R^2$ are each independently an aliphatic hydrocarbon group having 1 to 5 carbon atoms or an aromatic hydrocarbon group; a and b are each an integer of 1 to 9; and M is one metal selected from Li, Na, K, Mg, Ca, Sr, Ba, Al, Ge, Sn, Sb, Bi, Zn, Ti, Zr, Mn, Fe and Ce.

Examples of the metal salt of a disubstituted phosphinic acid include a metal salt of a dialkylphosphinic acid. The metal salt of a dialkylphosphinic acid can be prepared, for example, by reacting yellow phosphorus with an alkylating agent in the presence of a base, esterifying the resultant to give an ester mixture, isolating an ester of an alkylphosphonous acid from the obtained ester mixture, purifying the corresponding ester of the dialkylphosphinic acid by free radical-initiated reaction with olefins, and converting the ester of the dialkylphosphinic acid into the free acid or into the dialkylphosphinic acid salt of a metal from groups 1 to 5, 12, 14, 17 and 18 of the Periodic Table or of cerium. Further, the metal salt of a dialkylphosphinic acid is commercially available from CLARIANT in Germany. By containing the metal salt of a disubstituted phosphinic acid as an essential component, excellent flame retardancy, dielectric property, heat resistance and moisture resistance can be imparted.

M in formula (I) is one metal selected from the group consisting of Li, Na, K, Mg, Ca, Sr, Ba, Al, Ge, Sn, Sb, Bi, Zn, Ti, Zr, Mn, Fe and Ce. Preferred is Al or Na in view of the moisture resistance or of the fact that a phosphorus content in a compound can be increased, and particularly preferred is Al in view of the low dielectric property. $R^1$ and $R^2$ in formula (I) are each independently an aliphatic hydrocarbon group having 1 to 5 carbon atoms, or an aromatic hydrocarbon group. Preferred is an aliphatic hydrocarbon group having 1 to 5 carbon atoms in view of the fact that a phosphorus content in a compound can be increased. Examples of the aliphatic hydrocarbon group having 1 to 5 carbon atoms include a methyl group, an ethyl group, a propyl group, etc. Examples of the aromatic hydrocarbon group include phenyl, benzyl or alkyl-substituted group thereof. A methyl group, an ethyl group or a propyl group is particularly preferred.

For adjusting the dielectric constant of the thermosetting resin composition of the present invention to 3.0 or less, a thermosetting resin component is incorporated into the resin composition in addition to the component (1). For such a component, a thermosetting resin composition having a low dielectric constant can be used. For example, when a resin having a dielectric constant of 2.9 or less, such as the following component (2) is combined with the component (1), the dielectric constant of the resin composition of the present invention can be adjusted to 3.0 or less.

The resin having a dielectric constant of 2.9 or less at a frequency of 1 GHz or more, which is the component (2) of the present invention, is preferably, for example, one or more resin compositions selected from the group consisting of:

copolymer resin (2-1) comprising:

monomer unit (a) represented by formula (II):

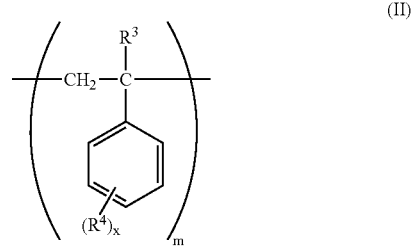

wherein $R^3$ is a hydrogen atom, a halogen atom or a hydrocarbon group having 1 to 5 carbon atoms; $R^4$s are each independently a halogen, atom, an aliphatic hydrocarbon group having 1 to 5 carbon atoms, an aromatic hydrocarbon group or a hydroxyl group; x is an integer of 0 to 3; and m is a natural number representing the repeating number of a monomer unit in a copolymer, and monomer unit (b) represented by formula (III):

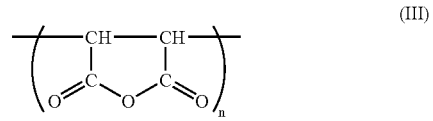

wherein n is a natural number representing the repeating number of a monomer unit in a copolymer;

copolymer resin (2-2) comprising:

monomer unit (c) represented by formula (IV):

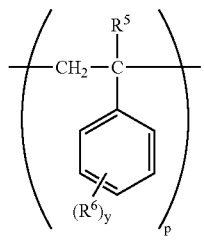

wherein $R^5$ is a hydrogen atom, a halogen atom or a hydrocarbon group having 1 to 5 carbon atoms; $R^6$s are each independently a halogen atom, an aliphatic hydrocarbon group having 1 to 5 carbon atoms, an aromatic hydrocarbon group or a hydroxyl group; y is an integer of 0 to 3; and p is a natural number representing the repeating number of a monomer unit in a copolymer, and monomer unit (d) represented by formula (V):

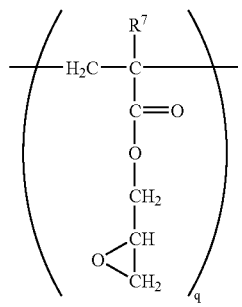

wherein $R^7$ is a hydrogen atom, a halogen atom or a hydrocarbon group having 1 to 5 carbon atoms; and q is a natural number representing the repeating number of a monomer unit in a copolymer; and resin (2-3) comprising:

monomer unit (e) represented by formula (VI):

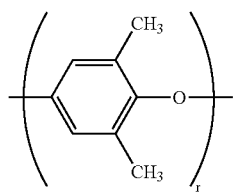

wherein r is a natural number representing the repeating number of a monomer unit in a polymer.

In view of improving the properties such as a dielectric constant, a dielectric dissipation factor, heat resistance, a glass transition temperature, resistance to soldering heat, and adhesiveness to a copper foil, the component (2) of the present invention is preferably one or more resin compositions selected from the group consisting of these (2-1), (2-2) and (2-3).

According to the present invention, in the copolymer resin (2-1) of the component (2) of the present invention, $R^3$ in formula (II) representing the monomer unit (a) includes a hydrogen atom, a halogen atom and a hydrocarbon group having 1 to 5 carbon atoms, and is preferably a hydrogen atom or a methyl group. x is preferably an integer of 0 to 3, and is more preferably 0. $R^4$s each independently include a halogen atom, an aliphatic hydrocarbon group having 1 to 5 carbon atoms, an aromatic hydrocarbon group and a hydroxyl group.

According to the present invention, the copolymer resin (2-1) may be a copolymer resin of styrenes and maleic anhydride, containing the monomer units (a) and (b). According to the present invention, in the copolymer resin (2-1), the monomer unit (a) preferably has a structure of, for example, styrene, 1-methylstyrene, vinyltoluene, dimethylstyrene, vinyl naphthalene, etc. The monomer unit (a) particularly preferably has a styrene structure in view of a low cost and compatibility with other resins. Further, various polymerizable components other than the above-described monomer units may be copolymerized, and examples of these various polymerizable components include vinyl compounds such as ethylene, propylene, isobutylene, acrylonitrile, etc.; diene compounds such as butadiene, etc.; and compounds having a methacryloyl group or an acryloyl group, such as methyl methacrylate, methyl acrylate, etc. A substituent can be optionally introduced through a Friedel-Crafts reaction or a reaction using a metal catalyst such as lithium, etc. Examples of the introduced substituent include an allyl group, a methacryloyl group, an acryloyl group, a hydroxyl group, etc.

According to the present invention, in the copolymer resin (2-1), apart of the monomer units (b) maybe reacted with various hydroxyl group-containing compounds, amino group-containing compounds, isocyanato group-containing compounds, epoxy group-containing compounds, etc., so as to optionally introduce a substituent. For example, it may be reacted with 2-hydroxyethyl acrylate, glycidyl methacrylate, methacryloyloxyethylisocyanate or allylamine so as to introduce a methacryloyl group, an acryloyl group or an allyl group.

According to the present invention, in the copolymer resin (2-1), m and n in formula (II) and formula (III) each represent the repeating number of the monomer unit (a) and the monomer unit (b) in the copolymer and are each a natural number of 1 or more. A copolymerization composition ratio of each monomer unit is preferably in the range of $0.8 \leq m/n \leq 19$ in view of a balance of a dielectric constant and a dielectric dissipation factor with a glass transition temperature, resistance to soldering heat, and adhesiveness to a copper foil. In view of dielectric property, m/n is further preferably 2 or more, and particularly preferably 4 or more. In view of glass transition temperature, heat resistance or adhesiveness, m/n is further preferably 9 or less, and particularly preferably 7 or less.

In view of a balance of heat resistance and a mechanical strength with formation processability at 200° C. or less, the weight average molecular weight of the copolymer resin (2-1) is preferably from 1,000 to 300,000.

The copolymer resin (2-1) in the component (2) of the present invention is particularly preferably a copolymer resin further comprising monomer unit (f) represented by formula (VII)

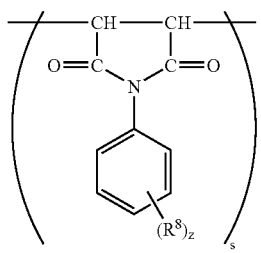

(VII)

wherein $R^8$ is a halogen atom, an aliphatic hydrocarbon group having 1 to 5 carbon atoms, an aromatic hydrocarbon group, a hydroxyl group, a thiol group or a carboxyl group; z is an integer of 0 to 3; and s is a natural number representing the repeating number of a monomer unit in a copolymer, in addition to the monomer unit (a) and the monomer unit (b).

The monomer unit (f) can be various kinds of N-substituted phenylmaleimides such as N-phenylmaleimide and N-hydroxyphenylmaleimide having a phenolic hydroxyl group, and can be obtained from a compound prepared by mixing at least one kind thereof. N-hydroxyphenylmaleimide is preferred in view of heat resistance, and N-hydroxyphenylmaleimide having a phenolic hydroxyl group at a para position is particularly preferred in view of flame retardancy.

The copolymer resin (2-1) comprising the monomer unit (f) is obtained by subjecting copolymerizable monomers including the monomer unit (a), the monomer unit (b) and the monomer unit (f) to radical polymerization and the like. It is also obtained by subjecting a monoamine compound corresponding to a monomer unit (f), for example, aniline, o-, m- or p-aminophenol, o-, m- or p-aminotoluene, or o-, m- or p-aminobenzyl alcohol to an addition (imidation) reaction in a polymer reaction with a previously prepared copolymer resin containing the monomer unit (a) and the monomer unit (b). In view of low cost and facility of the production, more preferred is the method for preparation by subjecting a monoamine compound corresponding to a monomer unit (f) to an addition (imidation) reaction in a polymer reaction with a previously prepared copolymer resin containing the monomer unit (a) and the monomer unit (b). For the monoamine compound, aniline, o-, m- or p-aminophenol is preferable in view of dielectric property, o-, m- or p-aminophenol is more preferable in view of heat resistance, and p-aminophenol is particularly preferable in view of flame retardancy.

In the copolymer (2-1), a copolymerization composition ratio among the monomer unit (a), the monomer unit (b) and the monomer unit (f) is preferably such that a ratio among m, n and s in formula (II), formula (III) and formula (VII) is in the range of $0.8 \leq m/(n+s) \leq 19$ in view of a balance with glass transition temperature, resistance to soldering heat and adhesiveness to a copper foil, more preferably in the range of $0.8 \leq m/(n+s) \leq 7$ in view of flame retardancy, and particularly preferably in the range of $2 \leq m/(n+s) \leq 7$ in view of dielectric constant and dielectric dissipation factor. Further, the composition ratio n/s is preferably in the range from 1/9 to 9 in view of a balance with glass transition temperature, resistance to soldering heat and adhesiveness to a copper foil, and particularly preferably in the range from 1/4 to 4 in view of flame retardancy, dielectric constant and dielectric dissipation factor.

The weight average molecular weight of the copolymer resin (2-1) is preferably from 1,000 to 300,000 in view of a balance of heat resistance and a mechanical strength with formability at 200° C. or less, also in the case where the monomer unit (f) is contained.

In the copolymer resin (2-2) of the component (2) of the present invention, $R^5$ in formula (IV) representing the monomer unit (c) includes a hydrogen atom, a halogen atom and a hydrocarbon group having 1 to 5 carbon atoms, and is preferably a hydrogen atom or a methyl group. $R^6$s each independently include a halogen atom, an aliphatic hydrocarbon group having 1 to 5 carbon atoms, an aromatic hydrocarbon group or a hydroxyl group. y is preferably an integer from 0 to 3, and more preferably 0.

According to the present invention, the copolymer resin (2-2) may be a copolymer resin comprising styrene and glycidyl methacrylate or glycidyl acrylate. According to the present invention, in the copolymer resin (2-2), the monomer unit (c) preferably has a structure of, for example, styrene, 1-methylstyrene, vinyltoluene, dimethylstyrene, vinylnaphthalene, etc. The monomer unit (c) particularly preferably has a styrene structure in view of a low cost and compatibility with other resins. These structures can be substituted with an allyl group, a methacryloyl group, an acryloyl group and a hydroxyl group. Further, various polymerizable components other than the above-described monomer units may be copolymerized, and examples of these various polymerizable components include vinyl compounds such as ethylene, propylene, isobutylene, acrylonitrile, etc.; diene compounds such as butadiene, etc.; and compounds having a methacryloyl group or an acryloyl group, such as methyl methacrylate, methyl acrylate, etc. A substituent can be optionally introduced through a Friedel-Crafts reaction or a reaction using a metal catalyst such as lithium, etc. Examples of the introduced substituents include an allyl group, a methacryloyl group, an acryloyl group, a hydroxyl group, etc.

According to the present invention, in the copolymer resin (2-2) in the component (2), $R^7$ in formula (V) representing the monomer unit (d) includes a hydrogen atom, a halogen atom or a hydrocarbon group having 1 to 5 carbon atoms, and is preferably a methyl group.

The monomer unit (d) preferably has a glycidyl methacrylate structure in view of a low cost and safety. A part of the monomer units (d) may be reacted with various hydroxyl group-containing compounds, amino group-containing compounds, carboxyl group-containing compounds and thiol group-containing compounds so as to optionally introduce substituents. For example, it may be reacted with 2-hydroxyethyl acrylate, glycidyl methacrylate, methacryloyloxyethylisocyanate or allylamine so as to introduce a methacryloyl group, an acryloyl group or an allyl group.

According to the present invention, in the copolymer resin (2-2), p and q in formula (IV) and formula (V) each represent the repeating number of the monomer unit (c) and the monomer unit (d) in the copolymer and are each a natural number of 1 or more. A copolymerization composition ratio of each monomer unit is particularly preferably in the range of $2 \leq p/q \leq 20$ in view of a balance of a dielectric constant and a dielectric dissipation factor with a glass transition temperature, resistance to soldering heat, and adhesiveness to a copper foil. In view of a balance of heat resistance and a mechanical strength with formation processability at 200° C. or less, the weight average molecular weight of the copolymer resin (2-2) is preferably from 1,000 to 300,000.

According to the present invention, the resin (2-3) in the component (2) of the present invention is a resin comprising the monomer unit (e). r in formula (VI) represents the repeating number of the monomer unit (e) in a polymer and is a natural number of 1 or more. The resin (2-3) is preferably one comprising, for example, a structure of polyphenylene ether resin. Examples thereof include a side chain introduced polyphenylene ether resin where a substituent such as a hydrocarbon group, an allyl group, etc. is introduced as apart of polyphenylene ether, for example, as a side chain thereof, and these can be used alone or in combination of two or more thereof. For example, an allyl group added polyphenylene ether resin and an n-butyl group added polyphenylene ether resin can be mentioned. For the resin (2-3), a resin produced by mixing polyphenylene ether and polystyrene through extrusion molding is particularly preferred in view of a low cost and formation processability.

The thermosetting nitrogen atom-containing resin, which is the component (3) of the present invention, is preferably a cyanate ester compound having two or more cyanate groups in one molecule, an isocyanurate compound having a reactive substituent, a melamine resin, dicyandiamide, etc. in view of flame retardancy or heat resistance, and particularly preferably a cyanate ester compound having two or more cyanate groups in one molecule and an isocyanurate compound having a reactive substituent, in view of low dielectric property.

Specific examples of the cyanate ester compound include 2,2-di(cyanatophenyl)propane, di(4-cyanato-3,5-dimethylphenyl)methane, di(4-cyanatophenyl)thioether, 2,2-di(4-cyanatophenyl)hexafluoropropane, di(cyanatophenyl)ethane; and a polycyanate ester of a copolymer of phenol and dicyclopentadiene, a phenolic novolak polycyanate, etc. These compounds can be used alone or in combination of two or more thereof. Of these, in view of dielectric property and heat resistance, preferred is 2,2-di(cyanatophenyl)propane, further preferred is such containing a mixture of a trimer and/or a larger polymer having a triazine ring previously formed by self-polymerization, and in view of a balance of a dielectric constant and a dielectric dissipation factor with heat resistance and prevention of gelation, particularly preferred is a compound in which 10 to 90% by mol of 2,2-di(cyanatophenyl)propane forms a trimer and/or a larger polymer.

In preparation process of the resin composition of the present invention, when a trimer and/or a larger polymer having a triazine ring is formed by self-polymerization in the component (3), it is effective that the component (2) is previously mixed with the cyanate ester compound and dissolved to form a semi-interpenetrating polymer network (semi-IPN) structure between the component (2) and a trimer and/or a larger polymer having a triazine ring derived from the cyanate ester compound. By virtue of having the semi-IPN structure, the resin composition can be improved in formability, glass transition temperature, adhesiveness to a copper foil, and dielectric property.

Examples of curing catalysts for the cyanate ester compound (cyanate ester resin) include organic acid metal catalysts such as zinc naphthenate, manganese naphthenate, titanium naphthenate, etc. Among these, zinc naphthenate and manganese naphthenate are preferred in view of dielectric property and heat resistance, and zinc naphthenate is particularly preferred in view of a reaction rate in the heat curing reaction. The amount of the curing catalyst used for the cyanate ester compound is preferably from 0.01 to 1.00% by weight based on the amount of the cyanate ester resin in view of a balance of a reaction rate in the heat curing reaction, dielectric property and electrolytic corrosion resistance with undesired gelation during synthesis and stability of resultant varnish.

Examples of the curing accelerator for the cyanate ester compound (cyanate ester resin) include compounds having a phenolic hydroxyl group, for example, monophenol compounds such as phenol, nonylphenol, phenoxyphenol, para-cumylphenol, etc., and polyhydric phenol compounds such as bisphenol A, phenol novolak resins, etc. Preferred is a monophenol compound in view of heat resistance, and particularly preferred is para-cumylphenol in view of dielectric property and heat resistance. The amount of the curing accelerator used for the cyanate-ester compound is preferably 0.01 to 1.00 in terms of the ratio of the equivalent of phenolic hydroxyl group in the curing accelerator to the equivalent of cyanate group in the cyanate ester resin (equivalent of phenolic hydroxyl group/equivalent of cyanate group) in view of a balance of dielectric property and heat resistance with drilling processability.

Examples of the isocyanurate compound having a reactive substituent include triallyl isocyanurate, trimetaallyl isocyanurate, diallylmonoglycidyl isocyanurate, monoallyldiglycidyl isocyanurate, triacryloylethyl isocyanurate, trimethacryloylethyl isocyanurate, etc. Of these, preferred are triallyl isocyanurate and triacryloylethyl isocyanurate in view of low-temperature curing property, and particularly preferred is triallyl isocyanurate in view of dielectric property.

Examples of the curing catalyst for the isocyanurate compound having a reactive substituent include organic peroxides such as benzoyl peroxide, 2,5-dimethyl-2,5-di(t-butylperoxy)-3-hexene-3, etc., which are radical initiators. Preferred is 2,5-dimethyl-2,5-di(t-butylperoxy)-3-hexene-3. The amount of the curing catalyst used for the isocyanurate compound is from 1 to 4% by weight based on the amount of the isocyanurate in view of reaction rate, heat resistance and stability of varnish.

In the thermosetting resin composition of the present invention, the component (1) is preferably mixed in an amount of from 1 to 100 parts by weight, more preferably from 10 to 100 parts by weight, particularly preferably from 20 to 90 parts by weight, based on 100 parts by weight in total amount of the components (2), (3) and (4), in view of a balance with flame retardancy, heat resistance and adhesiveness to a copper foil. When the amount of the component (1) mixed is small, flame retardancy is reduced.

In the present invention, as a component (4), an epoxy resin can be used as a modifier. By adding the epoxy resin to the compositions the resultant resin composition is improved in moisture resistance, heat resistance, and especially in heat resistance after moisture absorption. The epoxy resin used is not particularly limited as long as it is an epoxy resin having two or more epoxy groups in one molecule, and examples thereof include glycidyl ethers of bisphenol A type, bisphenol F type, biphenyl type, novolak type, multifunctional phenol type, naphthalene type, alicyclic type and alcohol type; glycidyl amines, and glycidyl esters. They may be used alone or in combination of two or more thereof. Of these, dicyclopentadiene-type epoxy resins, bisphenol A novolak-type epoxy resins, biphenyl-type epoxy resins, phenol novolak-type epoxy resins and polydimethylsiloxane-containing epoxy resins are preferred in view of dielectric property, heat resistance, moisture resistance and adhesiveness to a copper foil, and dicyclopentadiene-type epoxy resins, biphenyl-type epoxy resins, and bisphenol A novolak-type epoxy resins are particularly preferred in view of flame retardancy and formability.

Examples of the curing agent for the epoxy resin include acid anhydrides, amine compounds, phenolic-compounds, etc. Examples of the curing accelerator for the epoxy resin include imidazoles and derivatives thereof, tertiary amines, quaternary ammonium salts, etc.

According to the present invention, known thermoplastic resins, elastomers, flame retardants, fillers, etc., can be optionally used at the same time.

Examples of the thermoplastic resin include tetrafluoroethylene, polyethylene, polypropylene, polystyrene, polyphenylene ether resins, phenoxy resins, polycarbonate resins, polyester resins, polyamide resins, polyimide resins, xylene resins, petroleum resins, silicone resins, etc.

Examples of the elastomer include polybutadiene, acrylonitrile, epoxy-modified polybutadiene, maleic anhydride-modified polybutadiene, phenol-modified polybutadiene, carboxy-modified acrylonitrile, etc.

For examples of flame retardants other than the component (1), the following flame retardants can be used within the scope of the present invention. For example, phosphate-based flame retardants such as tricresyl phosphate, triphenyl phosphate, etc.; and inorganic flame retardants such as red phosphorus, antimony trioxide, aluminum hydroxide, magnesium hydroxide, etc. can be mentioned.

Examples of the filler include inorganic powder such as silica, mica, talc, glass short fiber or fine powder, hollow glass, etc., and organic powder such as silicone powder, tetrafluoroethylene, polyethylene, polypropylene, polystyrene, polyphenylene ether, etc.

In the present invention, an organic solvent can be optionally used, and the kind thereof is not particularly limited. Examples of the organic solvent include ketone solvents such as acetone, methyl ethyl ketone, methyl isobutyl ketone, cyclohexanone, etc.; alcohol solvents such as methyl cellosolve, etc.; ether solvents such as tetrahydrofuran, etc.; aromatic solvents such as toluene, xylene, mesitylene, etc.; dimethylformamide; dimethylacetamide; and N-methylpyrrolidone, etc. They may be used alone or in combination of two or more thereof.

In the present invention, an ultraviolet absorber, an antioxidant, a photopolymerization initiator, a fluorescent brightener, an adhesion improving agent, and the like can be optionally added to the resin composition, and the additive used is not particularly limited. Examples thereof include ultraviolet absorbers such as benzotriazole-type, etc.; antioxidants such as hindered phenol-type, styrenated phenol, etc.; photopolymerization initiators such as benzophenones, benzylketals, thioxanthone-type, etc.; fluorescent brighteners such as stilbene derivatives, etc.; and adhesion improving agents such as urea compounds (e.g. urea silane), silane coupling agents, etc.

The prepreg of the present invention is produced by impregnating or coating a base material with the thermosetting resin composition of the present invention. The prepreg of the present invention is described in detail below.

The prepreg of the present invention can be produced, for example, by impregnating or coating a base material with the thermosetting resin composition, which contains the component (1), the thermosetting resin component (2) cured with the component (1), and optionally the component (3), and then semicuring the resin composition (so as to be in a B-stage) by heating and the like. For the base material of the present invention, widely known base materials which have been used in various laminated boards for electrically insulating material can be used. Examples of materials for the base material include inorganic fibers such as E-glass, D-glass, S-glass, Q-glass, etc.; organic fibers such as polyimide, polyester, tetrafluoroethylene, etc.; and mixtures thereof. These base materials have forms of, for example, woven fabric, non-woven fabric, roving, chopped strand mat, surfacing mat, etc. The materials and forms of the base material are selected depending on the use or performance of a desired shaped product, and can be used alone or in combination of two or more thereof; if desired. The thickness of the base material is not particularly limited, and a base material having a thickness of, for example, about 0.03 to 0.5 mm can be used. A base material having a surface treated with a silane coupling agent or a base material treated by mechanical fiber-splitting is preferred in view of heat resistance or moisture resistance and processability. A base material is impregnated or coated with the resin composition so that the amount of the resin composition adhered to the base material is from 20 to 90% by weight in terms of the content of the resin in the dried prepreg, and then dried by heating generally at a temperature of 100 to 200° C. for 1 to 30 minutes to semicure the resin composition (so as to be in a B-stage), whereby the prepreg of the present invention can be obtained.

The laminated board of the present invention can be prepared by subjecting the prepreg of the present invention to laminate molding. The prepreg of the present invention is subjected to laminate molding, for example, in a structure where 1 to 20 pieces of the prepreg are piled on one another, and metal foils of copper and aluminum are placed on one surface or both surfaces of the piled prepregs, whereby the laminated board of the present invention can be produced. The metal foil is not particularly limited as long as it can be used in the use of electrically insulating materials. To conditions for molding, for example, methods employed for laminated board and multilayer board for electrically insulating materials are applicable. For example, using a multi-stage press, a multi-stage vacuum press, a continuous molding machine or an autoclave molding machine, molding can be conducted by heating at a temperature of 100 to 250° C. at a pressure of 2 to 100 kg/cm$^2$ for 0.1 to 5 hours. Further, the prepreg of the present invention and a wiring board for inner layer are combined with each other and subjected to laminate molding, whereby a multilayer board may be produced.

EXAMPLES

Hereinafter, the present invention is described in more detail by referring to the following Examples, however, these Examples by no means limit the scope of the present invention. In the following Examples, part(s) means part(s) by weight unless otherwise specified.

Substances used in Examples are described below.

A metal salt of a disubstituted phosphinic acid as component (1):

(1-1) Aluminum salt of methyl ethyl phosphinate

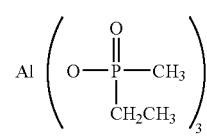

(1-2) Aluminum salt of diethyl phosphinate

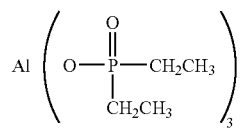

A resin as component (2):

(2-1-1) Copolymer resin comprising styrene and maleic anhydride (trade name: Dylark D-332; produced by Dylark, weight average molecular weight: 150,000, copolymerization composition ratio: a ratio between m and n in formula (II) and formula (III) is m/n=7)

(2-1-2) Copolymer resin comprising styrene and maleic anhydride (trade name: SMA-3000; produced by Elf Atochem, weight average molecular weight: 10,000, copolymerization composition ratio: a ratio between m and n in formula (II) and formula (III) is m/n=3)

(2-2) Copolymer resin comprising styrene and glycidyl methacrylate as copolymerizable components (trade name: REZEDA GP-505; produced by Toagosei Co., Ltd., weight average molecular weight: 50,000, epoxy equivalent: 1,724)

(2-3) Mixture comprising polyphenylene ether and polystyrene (trade name: NORIL; produced by General Electric Company; weight average molecular weight: 80,000; a mixing ratio between polyphenylene ether and polystyrene is =7/3 (polyphenylene ether/polystyrene) in terms of weight ratio).

A thermosetting nitrogen atom-containing resin as component (3):

(3-2) Triallyl isocyanurate

An epoxy resin as component (4):

(4-1) Biphenyl-type epoxy resin (epoxy equivalent: 193)

(4-2) Phenol novolak-type epoxy resin (epoxy equivalent: 189)

Curing catalyst or curing accelerator:
TEA: triethyl amine
ZnNph: zinc naphthenate
P-25B: 2,5-dimethyl-2,5-di(t-butylperoxy)-3-hexene-3
PCP: para-cumylphenol
2PZ: 2-phenyl imidazole Flame retardant (Comparative Examples):
A: red phosphorus (trade name: Hishiguard TP-10F, produced by Nippon Chemical Industrial Co., Ltd.)
B: triphenyl phosphate
C: phosphorus-containing epoxy resin (trade name: ZX-1548-4, produced by TOTO KASEI CO., LTD.)

Synthesis Example 1

Component (3): Preparation of Cyanate Ester Resin (3-1)

Into a 3 L-volume reactor equipped with a thermometer, a stirrer, and a condenser tube and being capable of heating and cooling were charged 1,519 g of 2,2-di(cyanatophenyl) propane, 23.1 g of para-cumylphenol, and 1,022 g of toluene. The mixture was heated to 80° C., and 0.22 g of an 8% by weight solution of zinc naphthenate was added thereto while maintaining the temperature at 77 to 83° C. After completion of the addition of the solution, a reaction was performed at 80° C. for 3.5 hours to obtain cyanate ester resin solution (3-1). The solid content of the solution (3-1) was 61% by weight, and a measurement using gel permeation chromatography confirmed that 45% by mol of 2,2-di(cyanatophenyl)propane as the raw material formed a trimer and/or a larger polymer by self-polymerization.

Synthesis Example 2

Components (2-1) and (3): (A-1) Preparation of Semi-IPN (Interpenetrating Polymer Network) Structure Between a Copolymer Resin Comprising Styrene and Maleic Anhydride, and a Cyanate Ester Resin Into a 5 L-volume reactor equipped with a thermometer, a stirrer, and a condenser tube and being capable of heating and cooling were charged 1,519 g of 2,2-di(cyanatophenyl) propane, 23.1 g of para-cumylphenol, 1,519 g of a copolymer resin comprising styrene and maleic anhydride (trade name: Dylark D-332, produced by Dylark), and 1,022 g of toluene. The mixture was heated to 100° C. and dissolved. After dissolution, 0.88 g of an 8% by weight solution of zinc naphthenate was added to the resultant solution while maintaining the temperature at 97 to 103° C. After completion of the addition of the solution, a reaction was performed at 120° C. for 5 hours to obtain solution (A-1) containing a semi-IPN (interpenetrating polymer network) structure between the copolymer resin comprising styrene and maleic anhydride, and a trimer and/or a larger polymer having a triazine ring derived from the cyanate ester resin. The solid content of the solution (A-1) was 67% by weight, and a measurement using gel permeation chromatography confirmed that 60% by mol of 2,2-di(cyanatephenyl)propane as the raw material formed a trimer and/or a larger polymer by self-polymerization. A copolymerization composition ratio between styrene and maleic anhydride was such that a ratio between m and n in formula (II) and formula (III) was m/n=7.0.

Synthesis Example 3

Components (2-2) and (3): (A-2) Preparation of Semi-IPN (Interpenetrating Polymer Network) Structure Between a Copolymer Resin Comprising Styrene and Glycidyl Methacrylate, and a Cyanate Ester Resin Into a 5 L-volume reactor equipped with a thermometer, a stirrer, and a condenser tube and being capable of heating and cooling were charged 1,519 g of 2,2-di(cyanatephenyl) propane, 23.1 g of para-cumylphenol, 1,519 g of a copolymer resin comprising styrene and glycidyl methacrylate (trade name: REZEDA GP-505, produced by Toagosei Co., Ltd.), and 1,022 g of toluene. The mixture was heated to 100° C. and dissolved. After dissolution, 0.88 g of an 8% by weight solution of zinc naphthenate was added to the resultant solution while maintaining the temperature at 97 to 103° C. After completion of the addition of the solution, a reaction was performed at 120° C. for 5 hours to obtain solution (A-2) containing a semi-IPN (interpenetrating polymer network) structure between the copolymer resin comprising styrene and glycidyl methacrylate, and a trimer and/or a larger polymer having a triazine ring derived from the cyanate ester resin. The solid content of the solution (A-2) was 67% by weight, and a measurement using gel permeation chromatography confirmed that 60% by mol of 2,2-di(cyanatephenyl)propane as the raw material formed a trimer and/or a larger polymer by self-polymerization. A copolymerization composition ratio between styrene and glycidyl methacrylate was such that a ratio between p and q in formula (IV) and formula (V) was p/q=15.

Synthesis Example 4

Components (2-3) and (3): (A-3) Preparation of Semi-IPN (Interpenetrating Polymer Network) Structure Between a Mixture Comprising Polyphenylene Ether and Polystyrene, and a Cyanate Ester Resin Into a 5 L-volume reactor equipped with a thermometer, a stirrer, and a condenser tube and being capable of heating and cooling were charged 759.5 g of a mixture comprising polyphenylene ether and polystyrene (trade name: NORIL, produced by General Electric Company), and 976 g of toluene. The mixture was heated to 100° C. and dissolved. After dissolution, 1519 g of 2,2-di(cyanatophenyl)propane and 11.5 g of para-cumylphenol were further added and dissolved. After dissolution, 0.88 g of an 8% by weight solution of zinc naphthenate was added to the resultant solution while maintaining the temperature at 97 to 103° C. After completion of the addition of the solution, a reaction was performed at 120° C. for 5 hours to obtain solution (A-3) containing a semi-IPN structure between the mixture comprising polyphenylene ether and polystyrene, and a trimer and/or a larger polymer having a triazine ring derived from the cyanate ester resin. The solid content of the solution (A-3) was 71% by weight, and a measurement using gel permeation chromatography confirmed that 60% by mol of 2,2-di(cyanatophenyl)propane as the raw material formed a trimer and/or a larger polymer by self-polymerization. A mixing ratio in the mixture comprising polyphenylene ether and polystyrene was 7/3(polyphenylene ether/polystyrene) in terms of weight ratio.

Synthesis Example 5

Component (2): Preparation of Copolymer Resin (2-1-3)

Into a 2 L-volume reactor equipped with a thermometer, a stirrer, a condenser tube and a water-content measuring apparatus and being capable of heating and cooling were charged 514 g of a copolymer resin comprising styrene and maleic anhydride (trade name: EF-40, produced by Sertomer Co.), 100 g of toluene and 120 g of cyclohexanone. The mixture was heated to 100° C., and 54.5 g of p-aminophenol was gradually added thereto. After completion of the addition of p-aminophenol, the resulting mixture was kept at 100° C. for 1 hour, then heated to 125 to 135° C. and reacted under reflux for 4 hours. Thereafter, the reaction mixture was cooled to about 90° C., and 237 g of methyl ethyl ketone was added thereto to obtain solution (2-1-3) of a copolymer resin comprising styrene, maleic anhydride and N-hydroxyphenylmaleimide. The solid content of the solution (2-1-3) was 55% by weight, and a copolymerization composition ratio of styrene, maleic anhydride and N-hydroxyphenylmaleimide was such that ratios among m, n, and s in formula (II), formula (III) and formula (VII) were m:n:s=8:1:1, m/(n+s)=4 and n/s=1 in terms of molar ratio. The weight average molecular weight was 10,000.

Synthesis Example 6

Component (2): Preparation of Copolymer Resin (2-1-4)

Into a 2 L-volume reactor having a thermometer, a stirrer, a condenser tube and a water-content measuring apparatus and being capable of heating and cooling were charged 514 g of a copolymer resin comprising styrene and maleic anhydride (trade name: EF-40, produced by Sertomer Co.), 100 g of toluene and 120 g of cyclohexanone. The mixture was heated to 80° C., and 46.5 g of aniline was gradually added thereto. After completion of the addition of aniline, the resulting mixture was kept at 80° C. for 1 hour, then heated to 125 to 135° C. and reacted under reflux for 4 hours. Thereafter, the reaction mixture was cooled to about 90° C., and 237 g of methyl ethyl ketone was added thereto to obtain solution (2-1-4) of a copolymer resin comprising styrene, maleic anhydride and N-phenylmaleimide. The solid content of the solution (2-1-4) was 55% by weight, and a copolymerization composition ratio of styrene, maleic anhydride and N-phenylmaleimide was such that ratios among m, n, and s in formula (II), formula (III) and formula (VII) were m:n:s=8:1:1, m/(n+s)=4 and n/s=1 in terms of molar ratio. The weight average molecular weight was 10,000.

Examples 1 to 18, Comparative Examples 1 to 6

The metal salt of a disubstituted phosphinic acid ((1-1) or (1-2)), which is component (1); the copolymer resin comprising styrene and maleic anhydride ((2-1-1) and (2-1-2)), the copolymer resin comprising styrene, maleic anhydride and N-hydroxyphenylmaleimide (2-1-3), the copolymer resin comprising styrene, maleic anhydride and N-phenylmaleimide (2-1-4), the copolymer resin comprising styrene and glycidyl methacrylate (2-2), and the mixture comprising polyphenylene ether and polystyrene (2-3), which are components (2); the cyanate ester resin (3-1) obtained in Synthesis Example 1 and isocyanurate compound (3-2), which are components (3); the polymers each having a semi-IPN structure with a cyanate ester resin obtained in Synthesis Examples 2 to 4, which are components (2) and (3) ((A-1), (A-2) and (A-3)); the epoxy resins which are components (4) ((4-1) and (4-2)); and further triethylamine, zinc naphthenate, 2,5-dimethyl-2,5-di(t-butylperoxy)-3-hexen-3 and para-cumylphenol as curing catalysts or curing accelerators, were mixed in blending ratios (part(s) by weight) shown in Tables 1 to 4 to obtain uniform varnishes.

The obtained varnishes were each formed to evaluation substrates of resin sheets and copper-clad laminated boards according to the following method, and the properties thereof were evaluated, respectively. The results are shown in Tables 1 to 4.

(a) Resin Sheet

The obtained varnishes were individually applied onto a PET film, and dried by heating at 160° C. for 10 minutes and the solids were taken out by a cast method. Then, the solids removed were pressed at a pressure of 25 kg/cm$^2$ at a temperature of 185° C. for 90 minutes to obtain resin sheets.

Using the thus obtained resin sheets, a dielectric constant (1 GHz) and a dielectric dissipation factor (1 GHz) were measured according to the following methods.

(b) Copper-clad Laminated Board

E-glass cloth having a thickness of 0.1 mm was impregnated and coated with each of the varnishes and dried by heating at 160° C. for 10 minutes to obtain a prepreg having a resin-content of 55% by weight.

Then, four pieces of each prepreg were laminated, 18 μm electrolytic copper foils were disposed on the upper and bottom surfaces of the prepregs and pressed at a pressure of 25 kg/cm$^2$ at a temperature of 185° C. for 90 minutes to obtain a copper-clad laminated board.

Then, the obtained copper-clad laminated boards were immersed in a copper etching solution to remove the copper foils to obtain evaluation substrates.

Using the thus obtained evaluation substrates of the copper-clad laminated boards, a dielectric constant (1 GHz), a dielectric dissipation factor (1 GHz), moisture absorption (water absorption), resistance to soldering heat, adhesion (peel strength), and a glass transition temperature were measured or evaluated according to the following methods.

(1) Measurement Method of Dielectric Constant and Dielectric Dissipation Factor

A dielectric constant and a dielectric dissipation factor of each of the obtained evaluation substrates of the resin sheets and the copper-clad laminated boards were measured at a frequency of 1 GHz using a dielectric constant measurement apparatus (trade name: HP4291B), produced by Hewlett-Packard Company.

(2) Measurement of Glass Transition Temperature

Evaluation was performed by observing thermal expansion properties of each of the obtained evaluation substrates of the copper-clad laminated boards using a TMA test apparatus.

(3) Evaluation of Flame Retardancy

From the evaluation substrates obtained by immersing the copper-clad laminated boards in a copper etching solution to remove the copper foils, test pieces cut out to a length of 127 mm and a width of 12.7 mm were produced. Then, flame retardancy of each test piece was evaluated according to the test method (V method) of UL-94.

(4) Evaluation of Resistance to Soldering Heat

The copper-clad laminated boards were immersed in a copper etching solution to remove the copper foils to produce evaluation substrates. Each of the obtained evaluation substrates was immersed in a solder bath at a temperature of 288° C. for 20 seconds. Then, resistance to soldering heat of each evaluation substrate was evaluated by observing the appearance of each substrate.

(5) Evaluation of Moisture Absorption (Water Absorption)

The copper-clad laminated boards were immersed in a copper etching solution to remove the copper foils to produce evaluation substrates. Each of the obtained evaluation substrates was subjected to pressure cooker treatment at 121° C. at 2 atm. for 4 hours using a pressure cooker test machine, produced by Hirayama Corporation. Then, water absorption of each evaluation substrate was measured.

(6) Evaluation of Adhesion (Peel Strength)

The copper-clad laminated boards were immersed in a copper etching solution to form thereon copper foils with a width of 1 cm to produce evaluation substrates. Then, peel strength of each evaluation substrate was measured using a rheometer.

TABLE 1

| | Item | | Example 1 | Example 2 | Example 3 | Example 4 | Example 5 | Example 6 |
|---|---|---|---|---|---|---|---|---|
| Mixed Amount [Part] | Component (1) | 1-1 | 62.4 | 77.4 | 61.7 | 60.6 | 62.4 | — |
| | | 1-2 | — | — | — | — | — | 69.6 |
| | Component (2) | 2-1-1 | — | 100.0 | — | 25.0 | — | — |
| | | 2-1-2 | 50.0 | — | — | — | 50.0 | — |
| | | 2-2 | — | — | 100.0 | — | — | 100.0 |
| | | 2-3 | — | — | — | 25.0 | — | — |
| | Component (3) | 3-1 | 100.0 | 100.0 | 100.0 | 100.0 | — | 100.0 |
| | | 3-2 | — | — | — | — | 100.0 | — |
| | Component (4) | 4-1 | 47.2 | 47.2 | — | — | 47.2 | — |
| | | 4-2 | — | — | — | 46.3 | — | — |
| | Curing Catalyst | TEA | 0.1 | 0.1 | 0.02 | 0.1 | 0.1 | 0.02 |
| | | ZnNph | 0.1 | 0.1 | 0.1 | 0.1 | — | 0.1 |
| | Curing Accelerator | PCP | 10.7 | 10.7 | 10.7 | 10.7 | 10.7 | 10.7 |
| | | P-25B | — | — | — | — | 3.0 | — |
| Evaluation Result | Dielectric Constant | a: Resin Sheet | 2.9 | 2.8 | 2.7 | 2.9 | 2.9 | 2.7 |
| | | b: Laminated Board | 3.5 | 3.4 | 3.3 | 3.5 | 3.5 | 3.3 |
| | Dielectric Dissipation Factor | a: Resin Sheet | 0.005 | 0.004 | 0.003 | 0.005 | 0.005 | 0.003 |
| | | b: Laminated Board | 0.007 | 0.006 | 0.005 | 0.007 | 0.007 | 0.005 |
| | Flame Retardancy | | V-0 | V-0 | V-0 | V-0 | V-0 | V-0 |
| | Moisture Absorption [% by weight] | | 0.5 | 0.5 | 0.6 | 0.4 | 0.5 | 0.4 |
| | Resistance To Soldering Heat | | good | good | good | good | good | good |
| | Peel Strength [kN/m] | | 1.2 | 1.0 | 1.2 | 1.4 | 1.2 | 1.2 |
| | Glass Transition Temperature [° C.] | | 180 | 185 | 182 | 185 | 175 | 180 |

TABLE 2

| | Item | | Example 7 | Example 8 | Example 9 | Example 10 | Example 11 | Example 12 |
|---|---|---|---|---|---|---|---|---|
| Mixed Amount [Part] | Component (1) | 1-1 | 77.4 | 77.4 | 77.4 | — | 61.7 | 77.0 |
| | | 1-2 | — | — | — | 69.6 | — | — |
| | Component (2) | 2-1-2 | — | — | 50.0 | — | — | — |
| | | 2-2 | — | — | — | — | 50.0 | — |
| | Semi-IPN between Component (2) and | A-1 | 200.0 | — | — | — | — | 200.0 |
| | | A-2 | — | 200.0 | — | 200.0 | — | — |
| | | A-3 | — | — | 150.0 | — | 150.0 | — |

TABLE 2-continued

| | Item | | Example 7 | Example 8 | Example 9 | Example 10 | Example 11 | Example 12 |
|---|---|---|---|---|---|---|---|---|
| | Component (3) | | | | | | | |
| | Component (4) | 4-1 | 47.2 | 47.2 | 47.2 | — | — | — |
| | | 4-2 | — | — | — | — | — | 46.3 |
| | Curing Catalyst | TEA | 0.1 | 0.1 | 0.1 | 0.02 | — | 0.1 |
| | | ZnNph | 0.1 | 0.1 | 0.1 | 0.1 | 0.1 | 0.1 |
| | Curing Accelerator | PCP | 9.2 | 9.2 | 9.2 | 9.2 | 9.2 | 9.2 |
| Evaluation Result | Dielectric Constant | a: Resin Sheet | 2.8 | 2.8 | 2.7 | 2.7 | 2.7 | 2.8 |
| | | b: Laminated Board | 3.4 | 3.4 | 3.3 | 3.3 | 3.3 | 3.4 |
| | Dielectric Dissipation Factor | a: Resin Sheet | 0.004 | 0.004 | 0.003 | 0.003 | 0.003 | 0.004 |
| | | b: Laminated Board | 0.006 | 0.006 | 0.005 | 0.005 | 0.005 | 0.006 |
| | Flame Retardancy | | V-0 | V-0 | V-0 | V-0 | V-0 | V-0 |
| | Moisture Absorption [% by weight] | | 0.5 | 0.5 | 0.6 | 0.4 | 0.5 | 0.4 |
| | Resistance To Soldering Heat | | good | good | good | good | good | good |
| | Peel Strength [kN/m] | | 1.4 | 1.4 | 1.6 | 1.4 | 1.6 | 1.2 |
| | Glass Transition Temperature [° C.] | | 190 | 200 | 190 | 185 | 175 | 180 |

TABLE 3

| | Item | | Comparative Example 1 | Comparative Example 2 | Comparative Example 3 | Comparative Example 4 | Comparative Example 5 | Comparative Example 6 |
|---|---|---|---|---|---|---|---|---|
| Mixed Amount [Part] | Phosphorus-Based Flame Retardant | A | | 16.0 | | | | |
| | | B | | | 59.5 | | | |
| | | C | | | | 188.1 | | |
| | Component (2) | 2-1-2 | 50.0 | 50.0 | 50.0 | 50.0 | — | — |
| | | 2-3 | — | — | — | — | — | 50.0 |
| | Component (3) | 3-1 | 100.0 | 100.0 | 100.0 | 100.0 | — | 100.0 |
| | | 3-2 | — | — | — | — | 100.0 | — |
| | Component (4) | 4-1 | 47.2 | 47.2 | 47.2 | 47.2 | 47.2 | — |
| | Curing Catalyst | TEA | 0.1 | 0.1 | 0.1 | 0.1 | 0.1 | — |
| | | ZnNph | 0.1 | 0.1 | 0.1 | 0.1 | — | 0.1 |
| | Curing Accelerator | PCP | 10.7 | 10.7 | 10.7 | 10.7 | — | 10.7 |
| | | P-25B | — | — | — | — | 3.0 | — |
| Evaluation Result | Dielectric Constant | a: Resin Sheet | 2.9 | 3.4 | 3.3 | 3.6 | 3.7 | 3.3 |
| | | b: Laminated Board | 3.5 | 4.0 | 3.8 | 4.2 | 4.3 | 3.8 |
| | Dielectric Dissipation Factor | a: Resin Sheet | 0.005 | 0.010 | 0.008 | 0.012 | 0.020 | 0.008 |
| | | b: Laminated Board | 0.007 | 0.015 | 0.012 | 0.020 | 0.025 | 0.012 |
| | Flame Retardancy | | inflammation | V-0 | inflammation | inflammation | inflammation | inflammation |
| | Moisture Absorption [% by weight] | | 0.9 | 0.9 | 1.2 | 2.0 | 1.6 | 0.9 |
| | Resistance To Soldering Heat | | good | swollen | swollen | swollen | swollen | swollen |
| | Peel Strength [kN/m] | | 1.2 | 1.0 | 0.2 | 0.5 | 0.4 | 1.2 |
| | Glass Transition Temperature [° C.] | | 180 | 185 | 110 | 85 | 150 | 140 |

TABLE 4

| | Item | | Example 13 | Example 14 | Example 15 | Example 16 | Example 17 | Example 18 |
|---|---|---|---|---|---|---|---|---|
| Mixed Amount [Part] | Component (1) | 1-1 | 55.0 | — | 55.0 | — | 55.0 | — |
| | | 1-2 | — | 63.0 | — | 63.0 | — | 63.0 |
| | Component (2) | 2-1-3 | 50.0 | 50.0 | — | — | 50.0 | — |
| | | 2-1-4 | — | — | 50.0 | 50.0 | — | 50.0 |
| | Component (3) | 3-1 | 100.0 | 100.0 | 100.0 | 100.0 | 100.0 | 100.0 |
| | Component (4) | 4-1 | 30.0 | 30.0 | 30.0 | 30.0 | — | — |
| | | 4-2 | — | — | — | — | 30.0 | 30.0 |
| | Curing | 2PZ | 0.5 | 0.5 | 0.5 | 0.5 | 0.5 | 0.5 |

TABLE 4-continued

| Item | | | Example 13 | Example 14 | Example 15 | Example 16 | Example 17 | Example 18 |
|---|---|---|---|---|---|---|---|---|
| | Catalyst | ZnNph | 0.1 | 0.1 | 0.1 | 0.1 | 0.1 | 0.1 |
| | | PCP | 4.5 | 4.5 | 10.7 | 10.7 | 4.5 | 4.5 |
| Evaluation Result | Dielectric Constant | a: Resin Sheet | 2.8 | 2.7 | 2.6 | 2.8 | 2.8 | 2.6 |
| | | b: Laminated Board | 3.4 | 3.3 | 3.2 | 3.4 | 3.4 | 3.2 |
| | Dielectric Dissipation Factor | a: Resin Sheet | 0.005 | 0.004 | 0.003 | 0.005 | 0.005 | 0.003 |
| | | b: Laminated Board | 0.007 | 0.006 | 0.005 | 0.007 | 0.007 | 0.005 |
| | Flame Retardancy | | V-0 | V-0 | V-0 | V-0 | V-0 | V-0 |
| | Moisture Absorption [% by weight] | | 0.5 | 0.5 | 0.6 | 0.4 | 0.5 | 0.4 |
| | Resistance To Soldering Heat | | good | good | good | good | good | good |
| | Peel Strength [kN/m] | | 1.3 | 1.1 | 1.3 | 1.5 | 1.3 | 1.3 |
| | Glass Transition Temperature [° C.] | | 185 | 190 | 187 | 190 | 180 | 185 |

As is apparent from Table 1, Table 2 and Table 4, the resin compositions in Examples 1 to 18 of the present invention are excellent in all of low dielectric property, low dielectric dissipation factor characteristics, flame retardancy, heat resistance, moisture resistance, and adhesiveness to a copper foil.

On the contrary, as is apparent from Table 3, the resin compositions in Comparative Examples have no such properties of the composition of the present invention and show poor flame retardancy, heat resistance, moisture resistance and adhesiveness to a copper foil.

INDUSTRIAL APPLICABILITY

The thermosetting resin composition of the present invention is excellent in low dielectric property, low dielectric dissipation factor characteristics, flame retardancy, heat resistance, moisture resistance, and adhesiveness to a copper foil. Accordingly, a prepreg obtained by impregnating or coating a base material with the composition, and a laminated board produced by subjecting the prepreg to lamination molding are excellent in low dielectric property, low dielectric dissipation factor, flame retardancy, heat resistance, moisture resistance, and adhesion to a copper foil and therefore, are useful for printed wiring boards for electronic appliances.

The invention claimed is:

1. A thermosetting resin composition comprising:
   (1) a metal salt of a disubstituted phosphinic acid, and
   (2) a resin having a dielectric constant of 2.9 or less at a frequency of 1 GHz or more.

2. The thermosetting resin composition according to claim 1, wherein the dielectric constant of the thermosetting resin composition is 3.0 or less at a frequency of 1 GHz or more.

3. The thermosetting resin composition according to claim 1, which further comprises (3) a thermosetting nitrogen atom-containing resin.

4. The thermosetting resin composition according to claim 1, wherein the component (2) is at least one resin compositions selected from the group consisting of:
   copolymer resin (2-1) comprising:
   monomer unit (a) represented by formula (II):

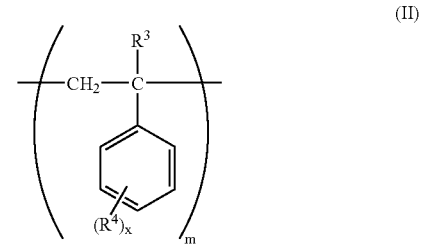

(II)

wherein $R^3$ is a hydrogen atom, a halogen atom or a hydrocarbon group having 1 to 5 carbon atoms; $R^4$s are each independently a halogen atom, an aliphatic hydrocarbon group having 1 to 5 carbon atoms, an aromatic hydrocarbon group or a hydroxyl group; x is an integer of 0 to 3; and m is a natural number representing the repeating number of a monomer unit in a copolymer, and monomer unit (b) represented by formula (III):

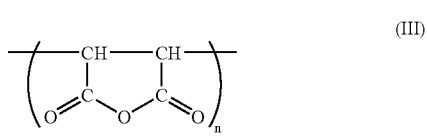

(III)

wherein n is a natural number representing the repeating number of a monomer unit in a copolymer;

copolymer resin (2-2) comprising:

monomer unit (c) represented by formula (IV):

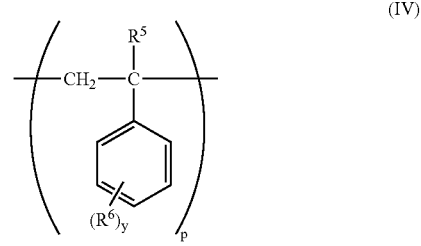

(IV)

wherein $R^5$ is a hydrogen atom, a halogen atom or a hydrocarbon group having 1 to 5 carbon atoms; $R^6$s are each independently a halogen atom, an aliphatic hydrocarbon group having 1 to 5 carbon atoms, an aromatic hydrocarbon group or a hydroxyl group; y is an integer of 0 to 3; and p is a natural number representing the repeating number of a monomer unit in a copolymer, and monomer unit (d) represented by formula (V):

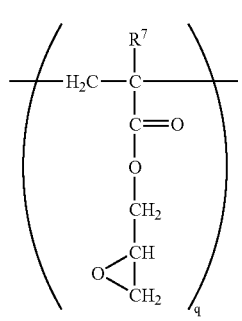
(V)

wherein $R^7$ is a hydrogen atom, a halogen atom or a hydrocarbon group having 1 to 5 carbon atoms; and q is a natural number representing the repeating number of a monomer unit in a copolymer; and resin (2-3) comprising:
monomer unit (e) represented by formula (VI):

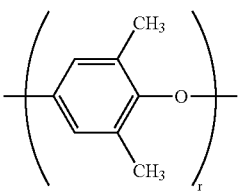
(VI)

wherein r is a natural number representing the repeating number of a monomer unit in a copolymer.

5. The thermosetting resin composition according to claim 4, wherein the copolymer resin (2-1) is a copolymer resin further comprising:
monomer unit (f) represented by the following formula (VII):

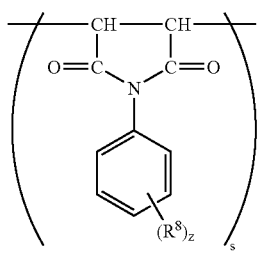
(VII)

wherein $R^8$ is a halogen atom, an aliphatic hydrocarbon group having 1 to 5 carbon atoms, an aromatic hydrocarbon group, a hydroxyl group, a thiol group or a carboxyl group; z is an integer of 0 to 3; and s is a natural number representing the repeating number of a monomer unit in a copolymer.

6. The thermosetting resin composition according to claim 1, which further comprises (4) an epoxy resin.

7. A prepreg using the thermosetting resin composition according to claim 1.

8. A laminated board obtained by using and laminate molding the prepreg according to claim 7.

9. A thermosetting resin composition comprising a metal salt of a disubstituted phosphinic acid, wherein a dielectric constant of the composition is 3.0 or less at a frequency of 1 GHz or more.

10. The thermosetting resin composition according to claim 2, which further comprises (3) a thermosetting nitrogen atom-containing resin.

11. The thermosetting resin composition according to claim 2, wherein the component (2) is at least one resin compositions selected from the group consisting of:
copolymer resin (2-1) comprising:
monomer unit (a) represented by formula (II):

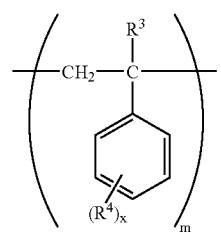
(II)

wherein $R^3$ is a hydrogen atom, a halogen atom or a hydrocarbon group having 1 to 5 carbon atoms; $R^4$s are each independently a halogen atom, an aliphatic hydrocarbon group having 1 to 5 carbon atoms, an aromatic hydrocarbon group or a hydroxyl group; x is an integer of 0 to 3; and m is a natural number representing the repeating number of a monomer unit in a copolymer, and monomer unit (b) represented by formula (III):

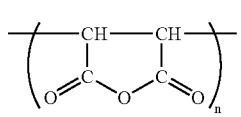
(III)

wherein n is a natural number representing the repeating number of a monomer unit in a copolymer;
copolymer resin (2-2) comprising:
monomer unit (c) represented by formula (IV):

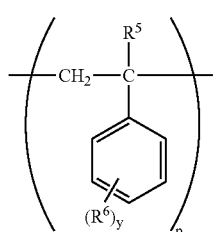
(IV)

wherein $R^5$ is a hydrogen atom, a halogen atom or a hydrocarbon group having 1 to 5 carbon atoms; $R^6$s are each independently a halogen atom, an aliphatic hydrocarbon group having 1 to 5 carbon atoms, an aromatic hydrocarbon group or a hydroxyl group; y is an integer of 0 to 3; and p is a natural number and representing the repeating number of a monomer unit in a copolymer, and monomer unit (d) represented by formula (V):

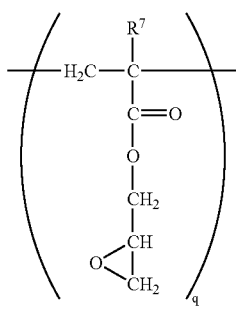

(V)

wherein $R^7$ is a hydrogen atom, a halogen atom or a hydrocarbon group having 1 to 5 carbon atoms; and q is a natural number representing the repeating number of a monomer unit in a copolymer; and resin (2-3) comprising:

monomer unit (e) represented by formula (VI):

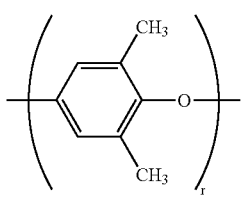

(VI)

wherein r is a natural number representing the repeating number of a monomer unit in a copolymer.

12. The thermosetting resin composition according to claim 2, which further comprises (4) an epoxy resin.

13. The thermosetting resin composition according to claim 1, wherein the metal salt of the disubstituted phosphinic acid is represented by formula (I):

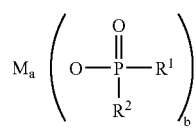

(I)

wherein $R^1$ and $R^2$ are each independently an aliphatic hydrocarbon group having 1 to 5 carbon atoms or an aromatic hydrocarbon group; a and b are each an integer of 1 to 9; and M is one metal selected from Li, Na, K, Mg, Ca, Sr, Ba, Al, Ge, Sn, Sb, Bi, Zn, Ti, Zr, Mn, Fe and Ce.

14. The thermosetting resin composition according to claim 9, wherein the metal salt of the disubstituted phosphinic acid is represented by formula (I):

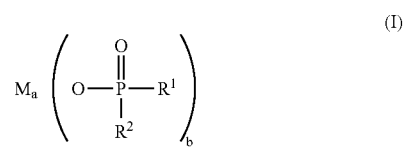

(I)

wherein $R^1$ and $R^2$ are each independently an aliphatic hydrocarbon group having 1 to 5 carbon atoms or an aromatic hydrocarbon group; a and b are each an integer of 1 to 9; and M is one metal selected from Li, Na, K, Mg, Ca, Sr, Ba, Al, Ge, Sn, Sb, Bi, Zn, Ti, Zr, Mn, Fe and Ce.

15. The thermosetting resin composition according to claim 1, wherein the metal salt of the disubstituted phosphinic acid is selected from the group consisting of (1-1) Aluminum salt of methyl ethyl phosphinate

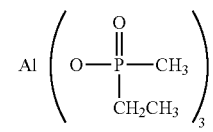

and (1-2) Aluminum salt of diethyl phosphinate

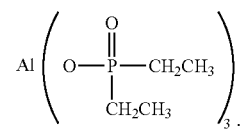

16. The thermosetting resin composition according to claim 9, wherein the metal salt of the disubstituted phosphinic acid is selected from the group consisting of (1-1) Aluminum salt of methyl ethyl phosphinate

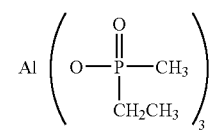

and (1-2) Aluminum salt of diethyl phosphinate

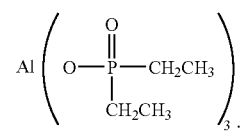

* * * * *